(12) United States Patent
Takahashi et al.

(10) Patent No.: US 11,887,659 B2
(45) Date of Patent: Jan. 30, 2024

(54) APPARATUSES AND METHODS FOR DRIVING DATA LINES IN MEMORY ARRAYS

(71) Applicant: MICRON TECHNOLOGY, INC., Boise, ID (US)

(72) Inventors: Yuhei Takahashi, Kanagawa (JP); Minari Arai, Saitama (JP)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 16/919,453

(22) Filed: Jul. 2, 2020

(65) Prior Publication Data

US 2022/0005522 A1  Jan. 6, 2022

(51) Int. Cl.
*G11C 11/4096* (2006.01)
*G11C 11/4091* (2006.01)
*G11C 11/408* (2006.01)

(52) U.S. Cl.
CPC ...... *G11C 11/4096* (2013.01); *G11C 11/4091* (2013.01); *G11C 11/4087* (2013.01)

(58) Field of Classification Search
CPC .................. G11C 11/4096; G11C 11/4091
USPC ........................................ 365/189.15
See application file for complete search history.

(56) References Cited

U.S. PATENT DOCUMENTS

| | | | |
|---|---|---|---|
| 2010/0202189 A1* | 8/2010 | Jung | G11C 7/02 365/149 |
| 2010/0329053 A1* | 12/2010 | Park | G11C 29/785 365/200 |
| 2011/0026337 A1* | 2/2011 | Kwack | G11C 7/18 365/193 |
| 2012/0195146 A1* | 8/2012 | Jun | G11C 7/062 365/207 |
| 2015/0179257 A1* | 6/2015 | Lee | G11C 13/004 365/148 |

* cited by examiner

*Primary Examiner* — Anthan Tran
(74) *Attorney, Agent, or Firm* — Dorsey & Whitney LLP

(57) ABSTRACT

In some examples, separate main I/O (MIO) lines may be used for writing to different banks of a memory array. In some examples, separate MIO lines may be used for writing to and reading from different memory banks. In some examples, the MIO lines for some banks may be used as shield lines between the MIO lines for other banks.

11 Claims, 7 Drawing Sheets

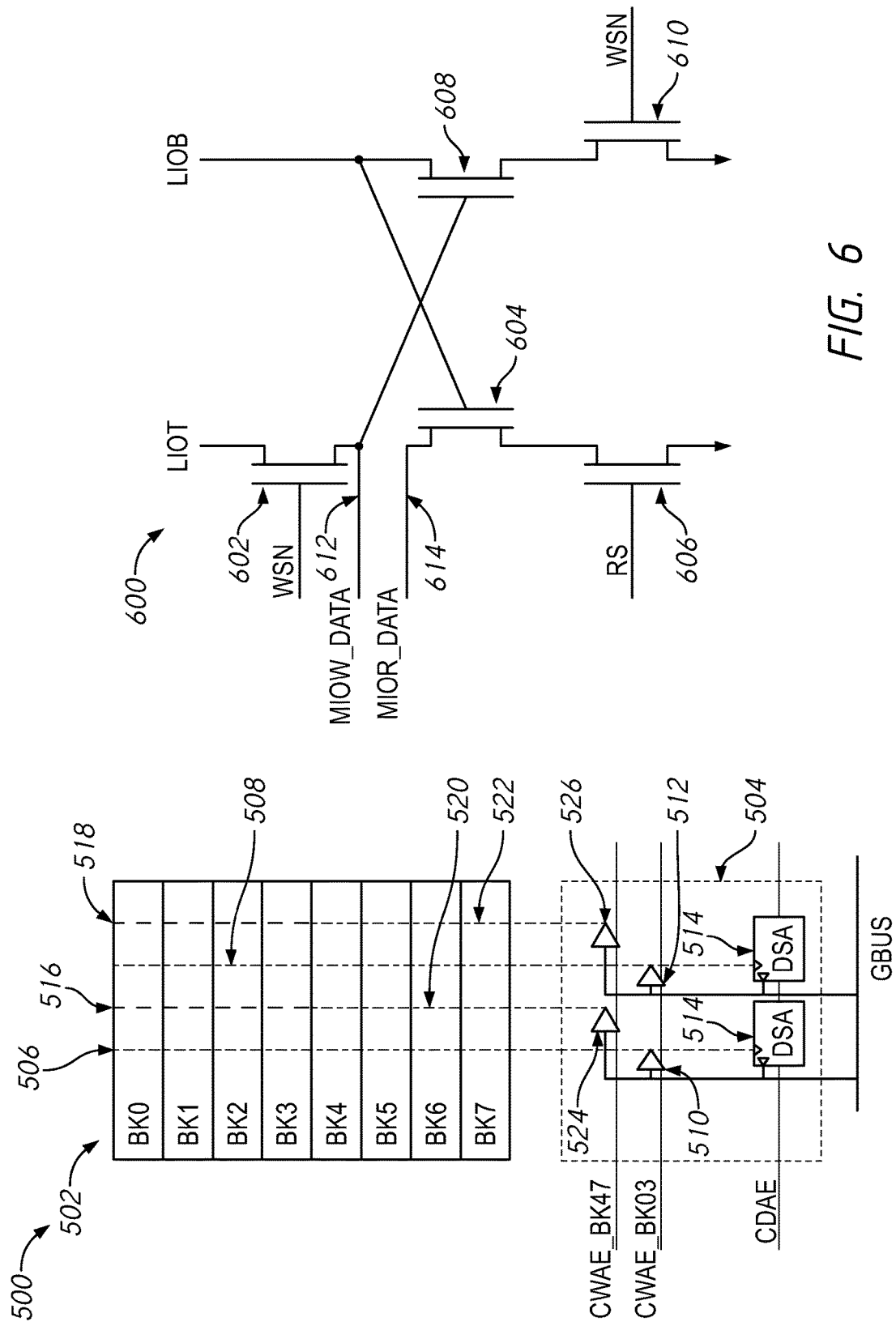

APPARATUSES AND METHODS FOR DRIVING DATA LINES IN MEMORY ARRAYS

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). For example, information may be written to the memory cells by charging or discharging a capacitive element. Stored information may be read from the memory cells by detecting the physical signal (e.g., sensing an amount of charge on the capacitive element). Memory cells are typically arranged in an array of rows and columns. The memory cells in a column may be coupled by an access line (e.g., a word line) and memory cells in a row may be coupled to another access line (e.g., a bit line). Thus, each memory cell may be at an intersection of a word line and a bit line. The memory cell may be accessed for reading and/or writing by activating the appropriate word line and bit line. In some applications, data from the memory cells may be provided from the bit lines to local data lines which may in turn provide the data to main data lines (sometimes referred to as main input/output (I/O) lines) which provide the data to a global data bus that provides the data to output terminals of the memory.

As memory arrays increase in capacity, the current required to drive the data lines may also increase. This may increase power consumption by the memory. Higher currents may also require the use of more expensive and/or larger components that can handle the higher currents. Accordingly, reducing current consumption of the memory may be desired.

BRIEF DESCRIPTION OF THE DRAWINGS

FIG. 5 is block diagram of a portion of a semiconductor memory device according to embodiments of the present disclosure.

FIG. 6 is a block diagram of a sub-amplifier of a semiconductor memory device according to embodiments of the present disclosure.

DETAILED DESCRIPTION

The following description of certain embodiments is merely exemplary in nature and is in no way intended to limit the scope of the disclosure or its applications or uses. In the following detailed description of embodiments of the present apparatuses, systems and methods, reference is made to the accompanying drawings which form a part hereof, and which are shown by way of illustration specific embodiments in which the described apparatuses, systems and methods may be practiced. These embodiments are described in sufficient detail to enable those skilled in the art to practice presently disclosed apparatuses, systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory array may be organized into one or more banks. Each bank may include one or more memory cells for storing data. During a write operation, data to be written to the memory cells may be provided to the banks by main data lines (e.g., MIO lines). Similarly, data may be received from the banks by the main data lines during a read operation. Typically, each main data line may provide/receive data for/from a portion of the memory cells in each bank. For example, in some applications, each bank may be further divided into one or more mats. If a memory array has eight banks, a main data line may provide data to a mat in each of the eight banks during a write operation. However, as the size and/or number of the banks increase, the current draw on the main data lines during memory operations also increases. In some applications, the current draw may be especially high during write operations when write drivers may be used to drive the write data on the main data lines.

According to embodiments of the present disclosure, separate main data lines may be used to provide data to different banks of the memory array for write operations. In these embodiments, a main data line (e.g., main input/output line) may provide data to portions of a subset of the banks (e.g., less than all of the banks). In some embodiments, some main data lines, while providing write data to a subset of the banks, may receive read data from all of the banks. In other embodiments, separate main data lines may be used to provide data to different banks of the memory array for both read and write operations. In some applications, using different main data lines for different banks may reduce current draw of the memory during memory operations, such as write operations.

Figure 1:
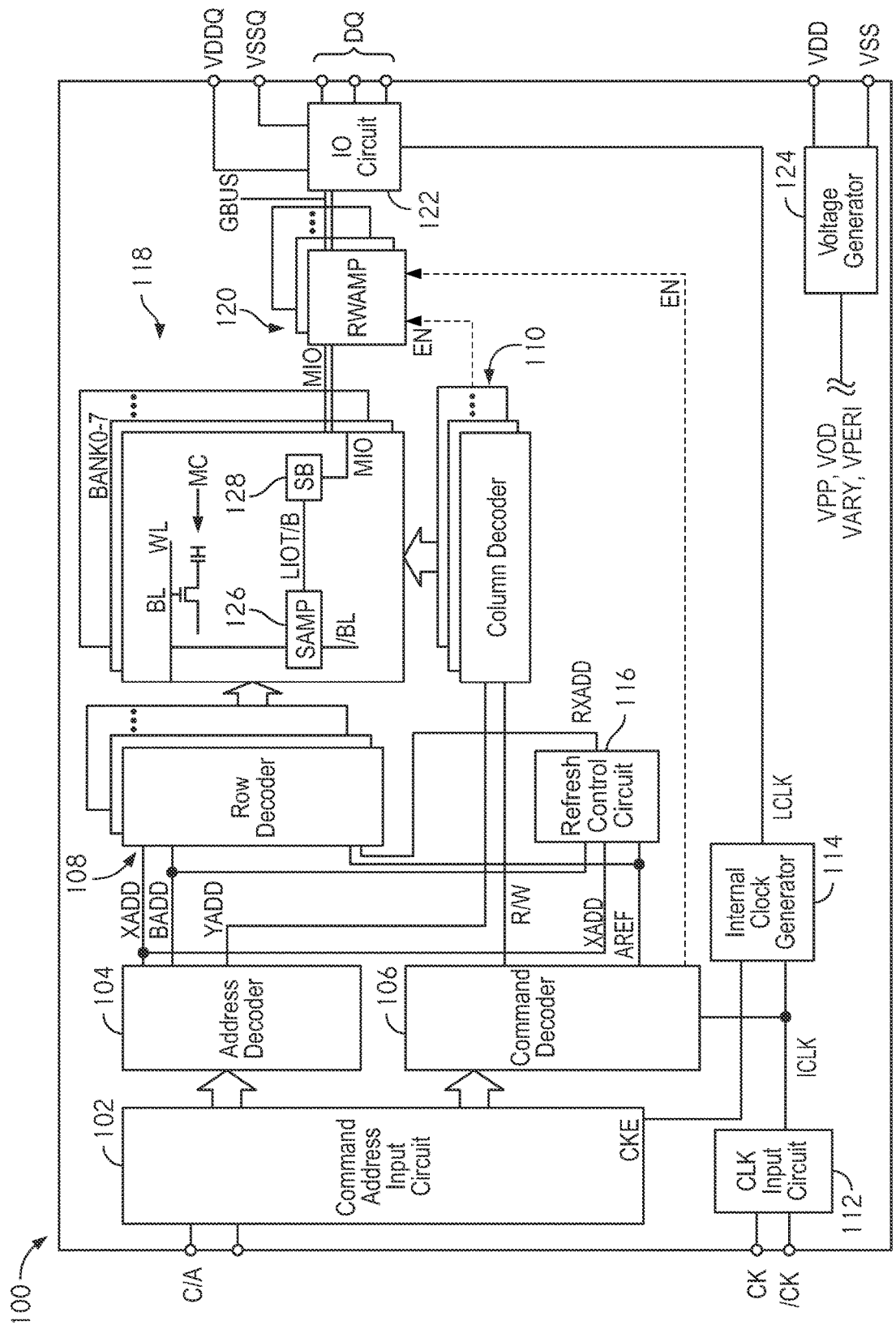
FIG. 1 is a block diagram of a semiconductor device according an embodiment of the disclosure.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP) 126. In the example shown in FIG. 1, sense amplifier 126 is a differential amplifier, which receives a differential signal from the bit lines BL and BL. Read data from the differential signal on bit lines BL or BL is amplified by the sense amplifier 126 and the differential signal is provided to a sub-amplifier (SB) 128 over complementary local data lines (LIOT/B). The sub-amplifier 128 may provide a differential signal to complementary main data lines (MIOT/B) or a single ended signal on a main data line (MO). The main data lines may provide the signal to a read/write amplifier (RWAMP) 120. The read/write amplifier 120 may provide the read data to an input/output (IO) circuit 122 over a global data bus (GBUS). Conversely, write data received from the IO circuit 122 via the global data bus is provided from the read/write amplifiers 120 over the main data lines MIO, the sub-amplifier 128, and the complementary local data lines LIOT/B to the sense amplifier 126, and written in the memory cell MC coupled to the bit line BL or /BL.

The read/write amplifier 120 may include one or more write drivers (not shown in FIG. 1) to drive write data on the main data lines during a write operation. In some embodiments, the write drivers of read/write amplifier 120 may be enabled by enable signals EN provided from the command decoder 106 and/or the column decoder 110. According to embodiments of the present disclosure, different (e.g., separate) main data lines and write drivers may be used for writing data to different banks of the memory array 118. In some examples, a main data line may be driven by a write driver to write to BANK0-3 of memory array 118 and another main data line driven by another write driver may be used to write to BANK4-7. Other divisions between the banks of the memory array 118 may be used in other examples (e.g., a main data line for BANK0 and BANK1, a main data line for BANK2 and BANK3, a main data line for BANK4 and BANK5, and a main data line for BANK6 and BANK7). In some embodiments, a main data line may be used by all the banks for read operations. In other embodiments, different main data lines may be used for both read and write operations to different banks of the memory array 118.

In some embodiments, the number of main data lines in semiconductor device 100 may be greater than a number of main data lines in a device where main data lines provide data to all of the banks of the memory array 118 during a write operation. As will be described in more detail herein, in some embodiments, some of the main data lines may be used as shield lines located between the main data lines. In some applications, these main data lines may replace shield lines included in conventional layouts, and as a result, may reduce, at least in part, an increase in layout area on semiconductor device 100 from including additional main data lines.

The semiconductor device 100 may employ a plurality of external terminals that include command and address (C/A) terminals coupled to a command and address bus to receive commands and addresses, and a chip select signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When an activate and read command are received, and a bank address, a row address and a column address are timely supplied with the activate and read commands, read data is read from memory cells in the memory array 118 corresponding to the row address and column address. The activate and read commands are received by the command decoder 106, which provides internal commands so that read data from the memory array 118 is provided to the read/write amplifiers 120. The read data is output to outside from the data terminals DQ via the IO circuit 122.

The device 100 may receive an access command which is a write command. When an activate and a write command are received, and a bank address, a row address and a column address are timely supplied with the activate and write commands, write data supplied to the data terminals DQ is written to a memory cells in the memory array 118 corresponding to the row address and column address. The activate and write commands are received by the command decoder 106, which provides internal commands so that the write data is received by data receivers in the IO circuit 122. Write clocks may also be provided to the external clock terminals for timing the receipt of the write data by the data receivers of the IO circuit 122. The write data is supplied via the IO circuit 122 to the read/write amplifiers 120, and by the read/write amplifiers 120 to the memory array 118 to be written into the memory cell MC.

Memory cells of the memory array 118 may require periodic refreshing to preserve data in the memory cells MC.

A refresh signal AREF may be supplied to the refresh control circuit 116. The refresh control circuit 116 supplies a refresh row address RXADD to the row decoder 108, which may refresh one or more wordlines WL indicated by the refresh row address RXADD. The refresh control circuit 116 may control a timing of the refresh operation, and may generate and provide the refresh address RXADD. The refresh control circuit 116 may be controlled to change details of the refreshing address RXADD, or may operate based on internal logic.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers 126 included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the IO circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the IO circuit 122 so that power supply noise generated by the 10 circuit 122 does not propagate to the other circuit blocks.

The structure and operation of a conventional memory device will be described with reference to FIGS. 2-4.

Figure 2:
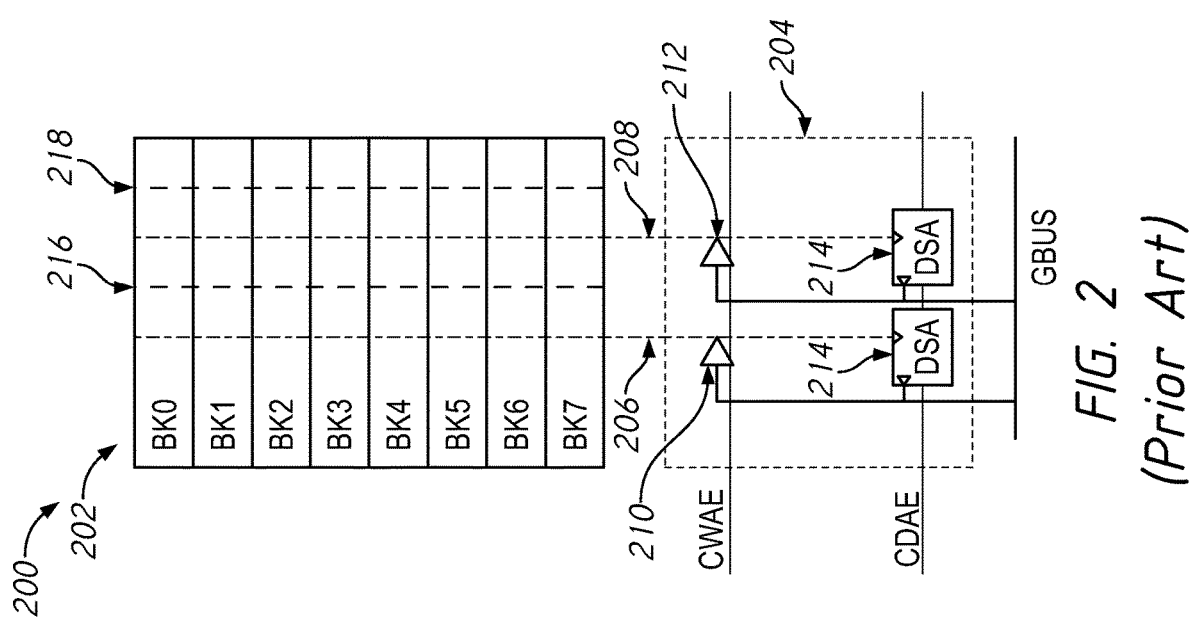
FIG. 2 is block diagram of a portion of a semiconductor memory device.

FIG. 2 is block diagram of a portion of a semiconductor memory device. The semiconductor memory device 200 may include a memory array 202 including multiple banks BK0-7. The memory array 202 may be coupled to a read/write amplifier 204 by main data lines 206, 208. The read/write amplifier 204 may include write drivers 210, 212, one for each main data line 206, 208. During a write operation, the read/write amplifier 204 may receive data from a global data bus (GBUS). The data may be driven by the write drivers 210, 212 onto the main data lines 206, 208 to be written to the appropriate bank(s) BK0-7 of the memory array 202. The appropriate write driver 210, 212 may be enabled by a write driver enable signal CWAE. During a read operation, the main data lines 206, 208 may provide read data to data sense amplifiers 214, which may amplify the read data for providing to the global data bus. The appropriate data sense amplifier 214 may be enabled by a read data sense amplifier signal CDAE.

During write operations, each main data line 206, 208 may provide data to portions of each of the banks BK0-7. For example, each of the banks BK0-7 may be divided into eight mats (not shown). Main data line 206 may provide data to the first mat in each bank BK0-7 and main data line 208 may provide data to the second mat in each bank BK0-7. Similarly, during read operations, each main data line 206, 208 may receive data from portions of each of the banks BK0-7. Although only two main data lines 206, 208 are shown in FIG. 2, there may be more main data lines included in semiconductor device 200. For example, the number of main data lines may equal a number of portions (e.g., number of mats) of each bank BK0-7. Similarly, there may be a number of write drivers corresponding to the number of main data lines.

The main data lines 206, 208 may be alternated with shield lines 216, 218. In some examples, shield lines 216, 218 may be coupled to a voltage source (e.g., VSS). Locating the shield lines 216, 218 between the main data lines 206, 208 may reduce electromagnetic field effects or other interference between main data lines 206, 208.

In the semiconductor memory device 200, the main data lines 206, 208 both extend the entire length of the memory array 202 to access all of the banks BK0-7. Thus, the current draw of the main data lines 206, 208 will be the same regardless of which bank(s) BK0-7 are written to.

Figure 3:
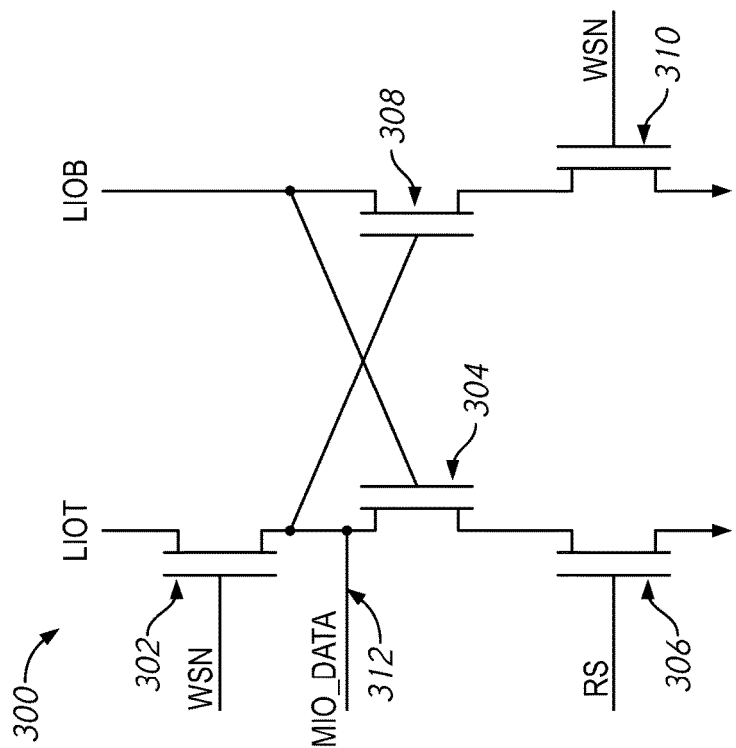
FIG. 3 is a block diagram of a sub-amplifier of a semiconductor memory device.

FIG. 3 is a block diagram of a sub-amplifier of a semiconductor memory device. Sub-amplifier 300 may be included in semiconductor device 200. During a write operation, the sub-amplifier 300 may receive data MIO_DATA from a main data line 312 (which may be main data line 206 and/or 208 in some examples) and provide the data as a differential signal on local data lines LIOT, LIOB. Similarly, during a read operation, the sub-amplifier 300 may receive data from memory cells as a differential signal from the local data lines and provide the data to the main data line 312 as MIO_DATA.

The sub-amplifier 300 may include transistor 302, transistor 304, and transistor 306 coupled in series along local data line LIOT. The sub-amplifier 300 may further include transistor 308 and transistor 310 coupled in series and further coupled to a local data line LIOB. Transistor 302 and transistor 310 may receive a write signal WSN at their respective gates. The write signal WSN may indicate a write operation. Transistor 306 may receive a read signal RS at its gate. The write signal WSN and read signal RS may be provided by a command decoder of the semiconductor memory device including the sub-amplifier 300. The gate of transistor 304 may be coupled to local data line LIOB and the gate of transistor 308 may be coupled to local data line LIOT.

During a write operation, write signal WSN may be in an active state. The active state of the write signal WSN may activate transistors 302 and 310. The read signal RS may be in an inactive state. The inactive state of the read signal RS may deactivate transistor 306. When transistors 302 and 310 are activated by the active write signal WSN, the data MIO_DATA from the main data line 312 may be provided as differential signals on local data lines LIOT, LIOB. Due to the cross coupling of transistors 304, 308, local data line LIOT may provide the data MIO_DATA from the main data line 312 and local data line LIOB may provide the complement of the data MIO_DATA.

During a read operation, the read signal may be in an active state, which may activate transistor 306. The write signal WSN may be in an inactive state, which may deactivate transistors 302 and 310. The main data line may receive read data from local data lines LIOT, LIOB and provide the read data as data MIO_DATA on the main data line 312.

Figure 4:
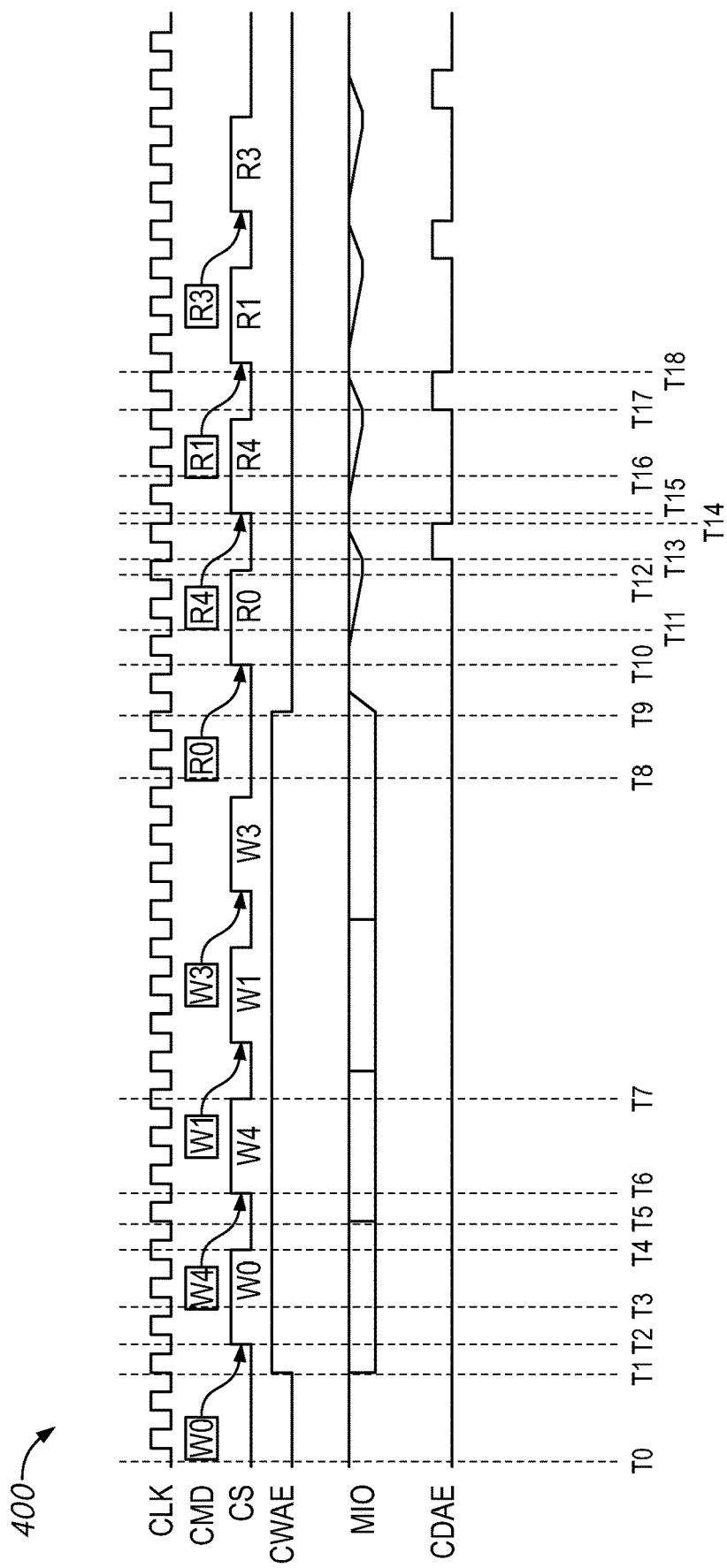
FIG. 4 is a timing diagram of various signals within a semiconductor memory device during memory operations.

FIG. 4 is a timing diagram of various signals within a semiconductor memory device during memory operations. The states of signals within semiconductor memory device 200 during read and write operations is reflected in timing diagram 400. The first line of timing diagram 400 illustrates a clock signal (CLK) that may be received by semiconductor memory device 200. The second line of timing diagram 400 illustrates commands (CMD) received by the semiconductor memory device 200. The third line of timing diagram 400 illustrates the state of a column select (CS) provided by the semiconductor memory device 200. The fourth line of timing diagram 400 illustrates a write driver enable signal (CWAE). The fifth line of timing diagram 400 illustrates the state of a main data line (MIO). The final line of timing diagram 400 illustrates the state of a data amplifier enable signal (CDAE).

At or around time T0, a write command W0 may be received by the semiconductor memory device. The write command W0 may indicate data is to be written to bank BK0 of the memory array 202. Responsive, at least in part, to the write command W0, the write drive enable signal CWAE may transition from an inactive (e.g., low) state to an active (e.g., high) state at or around time T1. The active CWAE signal may enable write driver 210 and/or 212 to drive data on a main data line. Also at or around time T1, data to be written to bank BK0 may be provided on the main data line MIO (e.g., main data line 216, 218). At or around time T2, responsive, at least in part to receiving the write command W0, the semiconductor memory device may provide a column select signal CS associated with the write command W0. Responsive, at least in part to the column select signal CS, data may be driven from the main data line to a sub-amplifier 300 to a sense amplifier to memory cells of the bank BK0.

At or around time T3, a write command W4 may be received by the semiconductor memory device 200. The write command W4 may indicate data is to be written to bank BK4 of the memory array 202. Responsive, at least in part, to the write command W4, the write drive enable signal CWAE may remain in the active state. At or around time T4, the column select signal CS may transition to an inactive state. At or around time T5, data to be written to bank BK4 may be provided on the main data line MIO. At or around time T6, responsive, at least in part to receiving the write command W4, the semiconductor memory device may provide a column select signal CS associated the write command W4 until at or around time T7. Responsive, at least in part to the column select signal CS, data may be driven from the main data line (e.g., main data line 216, 218) to sub-amplifier 300 to a sense amplifier to memory cells of the bank BK4.

As shown in timing diagram 400, additional write commands may be received by semiconductor memory device. Write operations may be performed in a similar manner to the write operations performed responsive to write commands W0 and W4.

At or around time T8, a read command R0 may be received by the semiconductor memory device 200. The read command R0 may indicate data is to be read from bank BK0 of the memory array 202. At or around time T9, the CWAE may transition to an inactive state which may disable write drivers 210, 212. At or around time T10, responsive at least in part to the read command R0, the semiconductor memory device may provide a column select signal CS associated with the read command R0. Responsive at least in part to the column select signal CS, at or around time T11, data from memory cells of bank BK0 may be provided on the main data line MIO.

Also at time Ti1, a read command R4 may be received by the semiconductor memory device. The read command R4 may indicate data is to be read from bank BK4 of the memory array 202. At or around time T12, the column select signal CS may transition to an inactive state. At or around time T13, the data amplifier enable signal CDAE may transition to an active state (e.g., high). The CDAE signal may enable data amplifiers 214, which may amplify data received from the main data lines 206, 208 and provide the read data from bank BK0 to a global data bus. At or around time T14, the CDAE signal may return to an inactive state (e.g., low), which may disable data amplifiers 214. At or around time T15, responsive at least in part to the read command R4, the column select signal CS may be provided associated with the read command R4. Responsive at least in part to the column select signal CS, data from memory cells of bank BK4 may be provided on the main data line MIO at or around time T16. At or around time T17, the data amplifier enable signal CDAE may transition to an active state. The CDAE signal may enable data amplifiers 214, which may amplify data received from the main data lines 206, 208 and provide the read data from bank BK4 to a global data bus. At or around time T18, the CDAE signal may return to an inactive state, which may disable data amplifiers 214.

As shown in timing diagram 400, additional read commands may be received by semiconductor memory device. Read operations may be performed in a similar manner to the read operations performed responsive to read commands R0 and R4.

As illustrated in timing diagram 400, when a main data line is used to provide write data to all of banks of a memory array, the same write drive enable signal CWAE is activated for write operations for any of the banks. When the main data line is also used to receive read data from all of the banks, the same data amplifier enable signal CDAE is activated for read operations to all banks of the memory array.

In contrast to the semiconductor memory device 200, in embodiments of the present disclosure, separate main data lines may be used to provide data to different banks of the memory array for write operations. In some embodiments, the main data lines may be different lengths (e.g., one is shorter than the other). The longer main data line may extend across all of the banks of the memory array in some embodiments. The longer main data line may or may not be coupled to all of the banks. The shorter main data line may extend over a subset of the banks. In some embodiments, the shorter main data line may extend over a subset of the banks that are closer to a read/write amplifier than the other banks. In some embodiments, the shorter main data line is used for write operations for the subset of banks. In other embodiments, the shorter main data line is used for both read and write operations for the subset of banks. The shorter main data line may draw less current during read and/or write operations due, at least in part, to its shorter length.

FIG. 5 is block diagram of a portion of a semiconductor memory device according to embodiments of the present disclosure. In some embodiments, semiconductor memory device 500 may be included in semiconductor memory device 100. The semiconductor memory device 500 may include a memory array 502 including multiple banks BK0-7. Memory array 502 may be included in memory array 118 in some embodiments. The memory array 502 may be coupled to a read/write amplifier 504 by main data lines 506, 508, 520, and 522. Read/write amplifier may be included in read/write amplifier 120 in some embodiments. The read/write amplifier 504 may include write drivers 510, 512, 524, and 526, one for each main data line 506, 508, 520, 522.

As shown in FIG. 5, main data lines 506 and 508 extend and/or are coupled to all of the banks BK0-7 of memory array 502. In contrast, main data lines 520 and 522 extend and/or are coupled to a subset of the banks. In some embodiments, the main data lines 520 and 522 may extend to a subset of the banks that are closer to the read/write amplifier 504 than the remaining banks, which may be farther from the read/write amplifier 504. In the example shown in FIG. 5, main data lines 520 and 522 extend to BK4-7 and are not coupled to banks BK0-3. According to embodiments of the present disclosure, main data lines 506 and 508 may receive data from portions of all banks BK0-7 during read operations and provide data to banks BK0-3 during write operations. Main data lines 520, 522 may provide data to portions of banks BK4-7 during write operations. In some examples, such as the one shown in FIG. 5, the main data lines 506, 508 may provide write data for a different subset of banks than main data lines 520, 522. That is, the subsets may be mutually exclusive in some embodiments. In some embodiments, the subsets may partially overlap and have access to a portion of the memory array 502. In some embodiments, main data lines 520, 522 are not be used for read operations.

Main data line 506 may receive data during a read operation from a same portion of a memory bank that main data line 520 provides data to during a write operation. Similarly, main data line 508 may receive data during a read operation from a same portion of a memory bank that main data line 522 provides data to during a write operation. For example, banks BK0-7 may each be divided into eight mats (not shown). Main data line 506 may receive data from the first mat of each bank BK0-7 during read operations and provide data to the first mat of each bank BK0-3 during write operations. Main data line 520 may provide data to the first mat of each bank BK4-7 during write operations. Main data line 508 may receive data from the second mat of each bank BK0-7 during read operations and provide data to the second mat of each bank BK0-3 during write operations. Main data line 522 may provide data to the second mat of each bank BK4-7 during write operations. Thus, in some embodiments, semiconductor memory device 500 may include more main data lines than semiconductor device 200.

In some embodiments, such as the one shown in FIG. 5, read/write amplifier 504 may include separate write drivers 510, 512, 524, and 526 for each main data line 506, 508, 520, and 522. The write drivers 510, 512 may be enabled by an enable signal CWAE_BK03 while write drivers 524, 526 are enabled by a separate enable signal CWAE_BK47 during write operations to the respective memory banks. Thus, in some embodiments, semiconductor memory device 500 may include more word drivers and enable signal lines than semiconductor device 200. In some embodiments, the enable signals may be provided by a command decoder, such as command decoder 106. In some embodiments, the enable signals may be provided via a column decoder, such as column decoder 110.

During a read operation, the main data lines 506, 508 may provide read data to data sense amplifiers 514 of the read/write amplifier 504, which may amplify the read data for providing to the global data bus. The appropriate data sense amplifier 514 may be enabled by a read data sense amplifier signal CDAE. In some examples, the read data sense amplifier signal CDAE may be provided by the command decoder and/or column decoder.

Although only four main data lines 506, 508, 520, 522 are shown in FIG. 5, there may be more main data lines included in semiconductor device 500. In some embodiments, the number of main data lines may equal twice a number of portions (e.g., number of mats) of banks BK0-7. For example, if banks BK0-7 are divided into eight memory mats, there may be sixteen main data lines. In some embodiments, there may be a number of write drivers corresponding to the number of main data lines (e.g., if there are sixteen main data lines, there are sixteen word drivers).

In some embodiments, such as the one shown in FIG. 5, the memory array 502 may include shield lines 516 and 518, similar to shield lines 216 and 218 in memory array 202. In some embodiments, shield lines 516, 518 may be coupled to a voltage source (e.g., VSS). However, unlike shield lines 216 and 218, shield lines 516 and 518 may extend over a subset of the banks BK0-7. In the example shown in FIG. 5, shield lines 516 and 518 extend over banks BK0-3. Instead of continuing shield lines 516 and 518 over the remaining banks, main data lines 520 and 522 may extend over banks BK4-7 where shield lines would be located in semiconductor memory device 200. As shown in FIG. 5, shield lines 516 and 518 may be aligned with the main data lines 520 and 522, respectively. Including main data lines 520 and 522 where shield lines 516 and 518 would typically extend may reduce an increase in layout area for the additional main data lines 520 and 522. The main data lines 506, 508 may be alternated with shield lines 516, 518 and main data lines 520, 522 (e.g., arranged in an alternating pattern/manner). Locating the shield lines 516, 518 between the main data lines 506, 508 may reduce electromagnetic field effects or other interference between main data lines 506, 508. In some applications, the main data lines 520, 522 may reduce the shielding between main data lines 506 and 508 compared to the shielding between main data lines 206, 206 by shield lines 216, 218. However, the reduced shielding may still be sufficient for proper operation for memory array 502. In some examples, main data lines 520, 522 may not be activated at the same times as main data lines 506, 508, which may mitigate the effects of the reduced shield lines 516, 518.

During a write operation to bank(s) BK0-3, main data line 506 and/or 508 may be driven by corresponding write driver 510, 512 to provide write data received from a global data bus (GBUS). In some applications, the current draw for write operations to bank(s) BK0-3 of memory array 502 may be the same as for write operations to bank(s) BK0-3 of memory array 202 of FIG. 2. During a write operation to bank(s) BK4-7, main data line 520 and/or 522 may be driven by corresponding write driver 524, 526. In some applications, the current draw for write operations to bank(s) BK4-7 of memory array 502 may be less than for write operations to bank(s) BK4-7 of memory array 202. The reduced current draw may be due, at least in part, to the shorter length of main data lines 520, 522. However, as noted, semiconductor memory device 500 may include more write drivers than semiconductor memory device 200. Thus, in some applications, memory device 500 may require a larger layout area for the read/write amplifier 504 than the read/write amplifier 204.

FIG. 6 is a block diagram of a sub-amplifier of a semiconductor memory device according to embodiments of the present disclosure. Sub-amplifier 600 may be included in semiconductor memory device 500 and/or semiconductor device 100 in some embodiments. For example, sub-amplifier 600 may be included in sub-amplifier 128. Sub-amplifier 600 may be included in banks that have separate main data lines for read and write operations. In the example shown in FIG. 5, sub-amplifier 600 may be included in banks BK4-7. In some embodiments, banks that have a same main data line for read and write operations (e.g., banks BK0-3 in FIG. 5) may utilize sub-amplifier 300 shown in FIG. 3.

The sub-amplifier 600 may include transistor 602 having a first node coupled to local data line LIOT and a second node coupled to a main data line 612 (which may be main data line 520 and/or 522 in some examples) that provides data for write operations MIOW_DATA. The gate of transistor 602 may receive a write signal WSN that indicates a write operation. In some embodiments, the write signal may be provided by a command decoder, such as command decoder 106. In some examples, the write signal WSN may be provided to the sub-amplifier 600 via a column decoder, such as column decoder 110, coupled to the command decoder. Sub-amplifier 600 may further include transistor 604 and transistor 606 coupled in series between another main data line 614 (which may be main data line 506 and/or 508 in some examples) that provides data for read operations MIOR_DATA and a voltage source (e.g., ground, VSS). The sub-amplifier 600 may further include transistor 608 and transistor 610 coupled in series between local data line LIOB and the voltage source (e.g., ground, VSS). A gate of transistor 610 may also receive the write signal WSN. Transistor 606 may receive a read signal RS at its gate that indicates a read operation. In some embodiments, read signal RS may be provided by the command decoder and/or column decoder. The gate of transistor 604 may be coupled to local data line LIOB and the gate of transistor 608 may be coupled to local data line LIOT.

During a write operation, write signal WSN may be in an active state. The active state of the write signal WSN may activate transistors 602 and 610. The read signal RS may be in an inactive state. The inactive state of the read signal RS may deactivate transistor 606. When transistors 602 and 610 are activated by the active write signal WSN, the data MIOW_DATA from the main data line 612 may be provided as differential signal on local data lines LIOT, LIOB. Due to the cross coupling of transistors 604, 608, local data line LIOT may provide the data MIOW_DATA from the main data line 612 and local data line LIOB may provide the complement of the data MIOW_DATA to a sense amplifier (not shown in FIG. 6), such as sense amplifier 126 in FIG. 1.

During a read operation, the read signal may be in an active state, which may activate transistor 606. The write signal WSN may be in an inactive state, which may deactivate transistors 602 and 610. The other main data line 614 may receive read data from local data lines LIOT, LIOB and provide the read data as data MIOR_DATA to a data sense amplifier, such as data sense amplifier 514. Thus, the sub-amplifier 600 may couple the local data lines LIOT and LIOB to the main data line 612 during a write operation and couple local data lines LIOT and LIOB to the main data line 614 during a read operation.

Returning to sub-amplifier 300 of FIG. 3, the transistor 302 and the transistor 304 share a common node (e.g., source/drain). In contrast, the transistor 602 and the transistor 604 have separate nodes due to being coupled to different main data lines 612 and 614. In some applications, the separate nodes for transistor 602 and 604 may cause sub-amplifier 600 to have a larger layout area than sub-amplifier 600.

Although in some embodiments the semiconductor memory device 500 may include more write drivers and/or at least some larger sub-amplifiers (e.g., sub-amplifier 600), which may require more layout area, in some applications, the disadvantages of an increased layout size may be offset by the advantages of decreased current consumption during at least some write operations.

Figure 7:
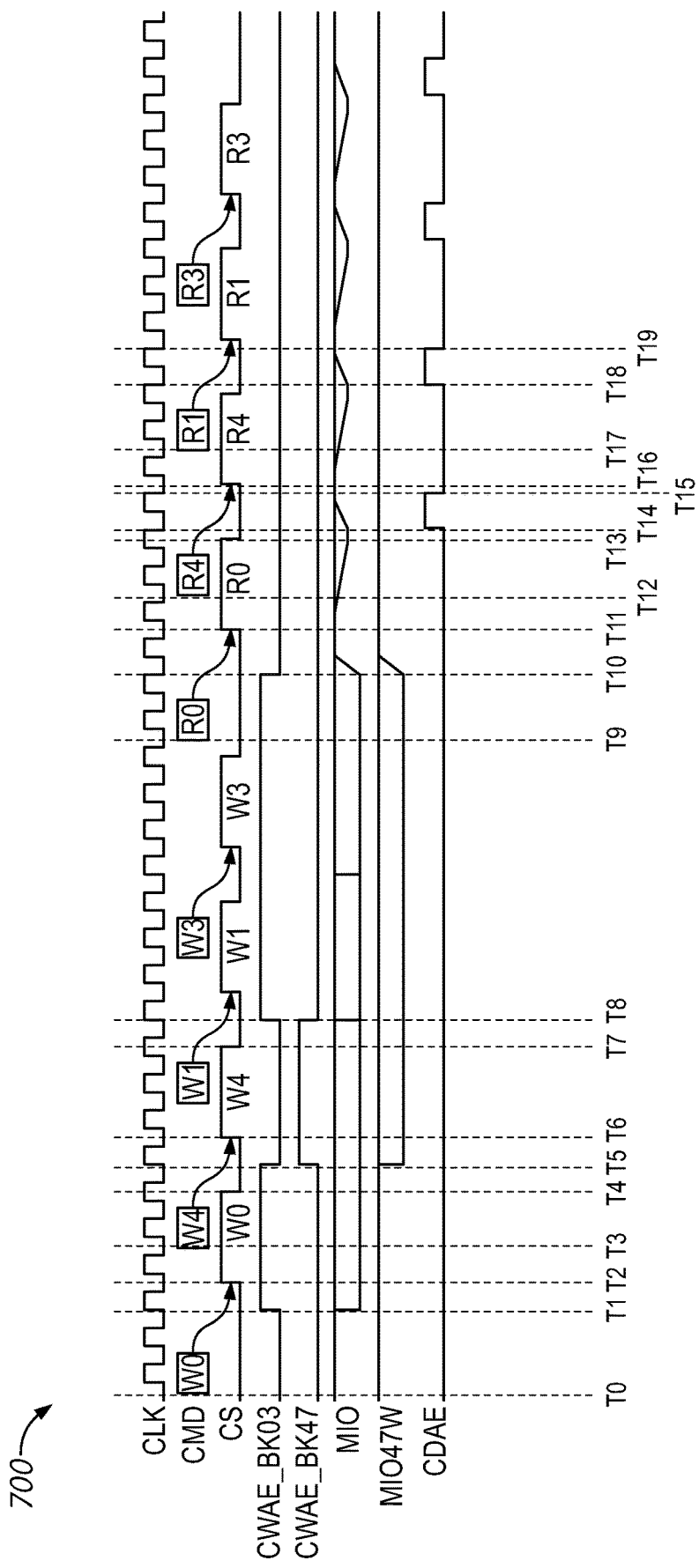
FIG. 7 is a timing diagram of various signals within a semiconductor memory device during memory operations according to embodiments of the present disclosure.

FIG. 7 is a timing diagram of various signals within a semiconductor memory device during memory operations according to embodiments of the present disclosure. The states of signals within semiconductor device 100 and/or semiconductor memory device 500 during read and write operations may be reflected in timing diagram 700, and the signals of timing diagram 700 will be described with reference to FIGS. 1 and 5. However timing diagram 700 may reflect the operation of other memory devices other than the specific memory device shown in FIGS. 1 and 5.

The first line of timing diagram 700 illustrates a clock signal (CLK). In some examples, the clock signal may be an internal clock signal generated by an internal clock generator, such as internal clock generator 114. The second line of timing diagram 700 illustrates commands (CMD). In some examples, the commands CMD may be received by a command decoder, such as command decoder 106. In some examples, the commands CMD may be provided to the memory device by another device, such as a memory controller (not shown). The third line of timing diagram 700 illustrates a column select signal (CS) provided by a column decoder, such as column decoder 110. The column select signal CS may be issued responsive to the command decoder receiving the command CMD. In some embodiments, the command decoder may provide a signal associated with the command CMD (e.g., internal command) to the column decoder and the column select signal CS may be provided responsive, at least in part, to the signal provided by the command decoder. The fourth line of timing diagram 700 illustrates the state of a write driver enable signal (CWAE_BK03). The write driver enable signal CWAE_BK03 may be provided to write drivers coupled to main data lines that that are coupled to all banks of a memory array, such as write drivers 510 and 512. The fifth line of timing diagram 700 illustrates the state of a write driver enable signal (CWAE_BK47). The write driver enable signal CWAE_BK47 may be provided to write drivers coupled to main data lines that that are coupled to a subset of banks of the memory array, such as write drivers 524 and 526. The sixth line of timing diagram 700 illustrates the state of a main data line (MIO) coupled to all banks of the memory array, such as main data lines 506 and 508. The seventh line of timing diagram 700 illustrates the state of a main data line (MIO47W) coupled to a subset of banks of the memory array, such as main data lines 520 and 522. The final line of timing diagram 700 illustrates the state of a data amplifier enable signal (CDAE), which may be provided to a data sense amplifier (e.g., data sense amplifier 514). In some embodiments, the various enable signals, CWAE_BK03, CWAE_BK47, and/or CDAE may be provided by the command decoder and/or column decoder.

At or around time T0, a write command W0 may be received by the semiconductor memory device (e.g., semiconductor device 100 and/or 500). In some examples, the write command W0 may be received by the command decoder 106 from an external device, such as a memory controller. The write command W0 may indicate data is to be written to bank BK0 of the memory array 502 (and/or BANK0 of memory array 118). Responsive, at least in part, to the write command W0, the write drive enable signal CWAE_BK03 may transition from an inactive (e.g., low) state to an active (e.g., high) state at or around time T1. The active CWAE_BK03 signal may enable write driver 510 and/or 512 to drive data on a main data line 506 and/or 508. Also at or around time T1, data to be written to bank BK0/BANK0 may be provided on the main data line MIO. At or around time T2, responsive, at least in part to receiving the write command W0, the column decoder may provide a column select signal CS associated with the write command W0. Responsive, at least in part to the column select signal CS, data may be driven from the main data line (e.g., MIO, main data line 506 and/or 508) to a sub-amplifier (e.g., sub-amplifier 300 and/or sub-amplifier 128) to a sense amplifier 126 to memory cells of the bank BK0/BANK0.

At or around time T3, a write command W4 may be received by the semiconductor memory device. The write command W4 may indicate data is to be written to bank BK4/BANK4 of the memory array. At or around time T4, the column select signal CS may transition to an inactive state. Responsive, at least in part, to the write command W4, the write drive enable signal CWAE_BK47 may transition to an active state and CWAE_BK03 may transition to an inactive state. The active CWAE_BK47 signal may enable write drivers 524, 526 and the inactive CWAE_BK03 signal may disable write drivers 510, 512. At or around time T5, data to be written to bank BK4/BANK4 may be provided on the main data line MIO47W (e.g., main data lines 520 and/or 522). At or around time T6, responsive, at least in part to receiving the write command W4, the column decoder may provide a column select signal CS associated with the write command W4 until at or around time T7. Responsive, at least in part to the column select signal CS, data may be driven from the main data line MIO47W to sub-amplifier 600 and/or 128 to a sense amplifier 128 to memory cells of the bank BK4/BANK4. At or around time T8, the CWAE_BK47 signal may transition to an inactive state (e.g., low), which may disable write drivers 524 and 526.

As shown in timing diagram 700, additional write commands may be received by semiconductor memory device. Write operations to BK0-3/BANK0-3 may be performed in a similar manner to the write operation performed responsive to write command W0 and write operations to BK4-7/BANK4-7 may be performed in a similar manner to the write operation performed responsive to write command W4.

At or around time T9, a read command R0 may be received by the command decoder. The read command R0 may indicate data is to be read from bank BK0/BANK0 of the memory array. At or around time T10, the CWAE_BK03 may transition to an inactive state which may disable write drivers 510, 512. At or around time T11, responsive at least in part to the read command R0, the column decoder may provide a column select signal CS associated with the read command R0. Responsive at least in part to the column select signal CS, at or around time T12, data from memory cells of bank BK0/BANK0 may be provided on the main data line MIO (e.g., main data line 506 and/or 508).

Also at or around time T12, a read command R4 may be received by the command decoder. The read command R4 may indicate data is to be read from bank BK4/BANK4 of the memory array. At or around time T13, the column select signal CS may transition to an inactive state. At or around time T14, the data amplifier enable signal CDAE may transition to an active state (e.g., high). The CDAE signal may enable data amplifiers 514, which may amplify data received from the main data lines 506, 508 and provide the read data from bank BK0/BANK0 to a global data bus. At or around time T15, the CDAE signal may return to an inactive state (e.g., low), which may disable data amplifiers 514. At or around time T16, responsive at least in part to the read command R4, the column select signal CS may be provided associated with the read command R4. Responsive at least in part to the command signal CS, data from memory cells of bank BK4/BANK4 may be provided on the main data line MIO at or around time T17. At or around time T18, the data amplifier enable signal CDAE may transition to an active state. The CDAE signal may enable data amplifiers 514, which may amplify data received from the main data lines 506, 508 and provide the read data from bank BK4/BANK4 to a global data bus. At or around time T19, the CDAE signal may return to an inactive state, which may disable data amplifiers 514.

As shown in timing diagram 700, additional read commands may be received by semiconductor memory device. Read operations may be performed in a similar manner to the read operations performed responsive to read commands R0 and R4.

As shown in timing diagram 700, write operations for one group (e.g., subset) of banks utilize a different main data line and activate a different write driver enable signal than another group of banks, unlike as shown in timing diagram 400, which utilizes the same write driver enable signal and main data line for all write operations. In the example shown in FIG. 7, write operations for banks BK0-3/BANK0-3 utilize main data line MIO and activate write driver enable signal CWAE_BK03, while write operations for banks BK4-7/BANK4-7 utilize main data line MIO47W and activate write driver enable signal CWAE_BK47. However, similar to as shown in timing diagram 400, the read operations for all of the banks utilize the same main data line and activate the same data amplifier enable signal. For example, as shown in FIG. 7, read operations for banks BK0-7/BANK0-7 utilize a same main data line MIO.

Figure 8:
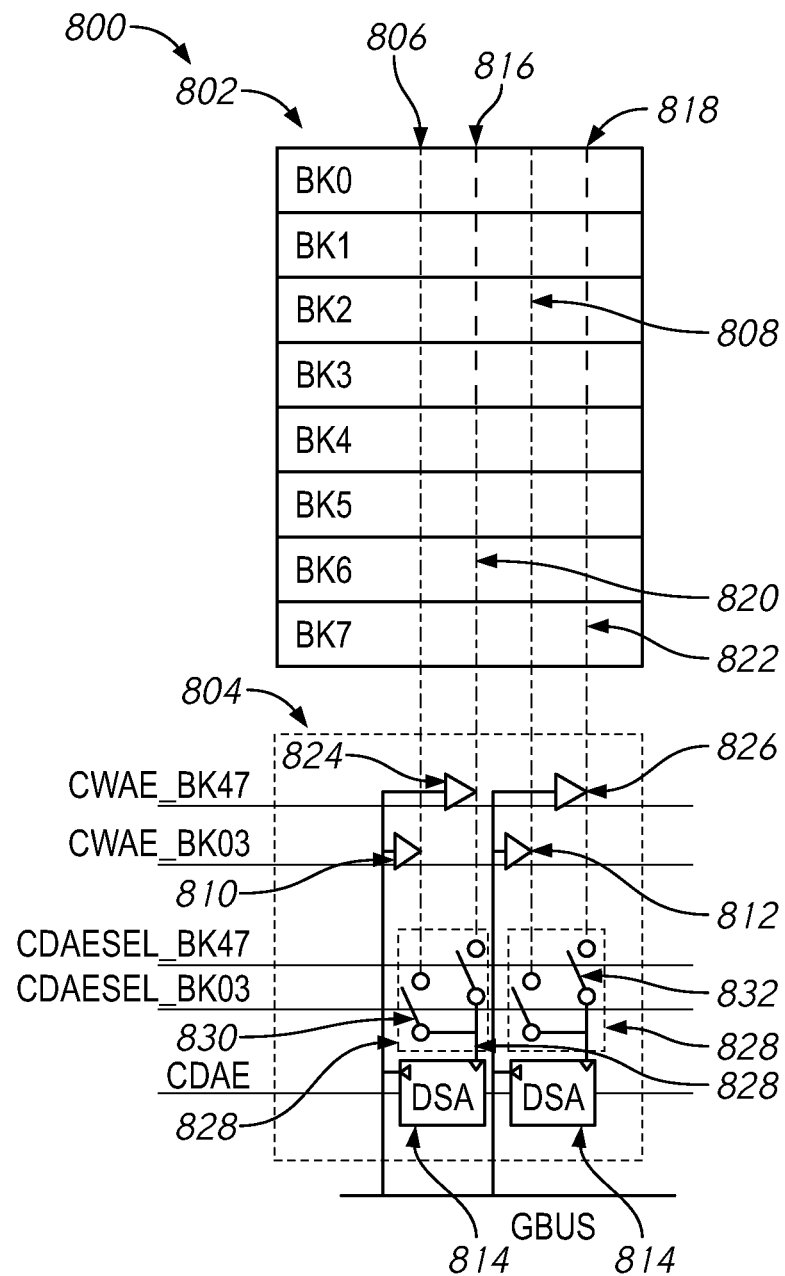
FIG. 8 is block diagram of a portion of a semiconductor memory device according to embodiments of the present disclosure.

FIG. 8 is block diagram of a portion of a semiconductor memory device according to embodiments of the present disclosure. In some embodiments, semiconductor memory device 800 may be included in semiconductor memory device 100. The semiconductor memory device 800 may include a memory array 802 including multiple banks BK0-7. Memory array 802 may be included in memory array 118 in some embodiments. The memory array 802 may be coupled to a read/write amplifier 804 by main data lines 806, 808, 820, and 822. Read/write amplifier may be included in read/write amplifier 120 in some embodiments. The read/write amplifier 804 may include write drivers 810, 812, 824, and 826, one for each main data line 806, 808, 820, 822. In some embodiments, main data lines 806, 808, 820, 822 and write drivers 810, 812, 824, 826 of semiconductor memory device 800 may perform substantially the same during write operations as the corresponding components in semiconductor device 500. In some embodiments, shield lines 816 and 818 may be substantially the same as shield lines 516 and 518. Accordingly, detailed descriptions of these components are not provided with reference to FIG. 8.

In some embodiments, main data lines that are coupled to a subset of memory banks may receive data from a memory array during read operations, not just provide data during write operations. For example, main data lines 820 and 822 may be coupled to banks BK4-7. During read operations, main data lines 820 and 822 may receive data from portions of banks BK4-7 and provide the read data to the read/write amplifier 804 rather than main data lines 806 and 808. Using main data lines 820 and 822 for read operations may provide current consumption reductions for at least some read operations.

In some embodiments, the data sense amplifiers 814 may be shared by two or more main data lines. For example, as shown in FIG. 8, main data lines 806 and 820 may share a data sense amplifier 814 and main data lines 808 and 822 may share a data sense amplifier 814. In some embodiments, the read/write amplifier 804 may include selection circuit 828 to selectively couple main data lines to data sense amplifiers 814. In the example shown in FIG. 8, for each data sense amplifier 814, selection circuit 828 may include a switch 830 for selectively coupling and decoupling main data line 806, 808 to the data sense amplifier 814 and a switch 832 for selectively coupling and decoupling main data line 820, 822 to the data sense amplifiers 814. More generally, switch 830 may selectively couple and decouple a main data line that is coupled to at least a subset of banks BK0-7 of memory array 802 and switch 832 may selectively couple and decouple a main data line that is coupled to another subset of banks BK0-7. In the example shown in FIG. 8, main data lines 806, 808 are coupled to at least banks BK0-3 and main data lines 820, 822 are coupled to banks BK4-7. Switch 830 may be controlled by a control signal CDAESEL_BK03 and switch 832 may be controlled by control signal CDAESEL_BK47. The control signals may be provided by a command decoder, such as command decoder 106, and/or a column decoder, such as column decoder 110, in some embodiments.

During a read operation on an address corresponding to bank(s) BK0-3, control signal CDAESEL_BK03 may be in an active state. Responsive to the active state, the switch 830 may couple main data line 806 and/or main data line 808 to the data sense amplifier 814. Control signal CDAESEL_BK47 may be in an inactive state. Responsive to the inactive state, the switch 832 may decouple main data lines 820 and 822 from the data sense amplifier 814. Read data may be provided from bank(s) BK0-3 to the data sense amplifier 814 via main data line 806 and/or 808.

During a read operation on an address corresponding to bank(s) BK4-7, control signal CDAESEL_BK03 may be in an inactive state. Responsive to the inactive state, the switch 830 may decouple main data lines 806 and 808 from the data sense amplifier 814. Control signal CDAESEL_BK47 may be in an active state. Responsive to the active state, the switch 832 may couple main data lines 820 and/or 822 to the data sense amplifier 814. Read data may be provided from bank(s) BK4-7 to the data sense amplifier 814 via main data line 820 and/or 822.

Although the example in FIG. 8 shows selection circuit 828 including switches 830 and 832, in other embodiments, selection circuit 828 may include a single switch that selectively toggles between main data line 806 and 820 (main data line 808 and 822) based on a state of a control signal. Other suitable control logic for selective coupling and/or decoupling the main data lines to the data sense amplifiers may also be used.

In the semiconductor memory device 800, when main data lines 820 and 822 are used for both read and write operations, in some embodiments, semiconductor memory device may include sub-amplifiers 300 rather than sub-amplifiers 600 because the banks provide data to and receive data from a same main data line. Thus, in some embodiments, the sub-amplifiers of semiconductor memory device 800 may have a smaller layout area than the sub-amplifiers of semiconductor memory device 500. However, in some embodiments, the control logic 828 may increase the layout requirements of semiconductor memory device 800 compared to semiconductor memory device 200 and/or semiconductor memory device 500. In some applications, the advantages of reduced current consumption for at least some of both read and write operations may outweigh the disadvantages of increase in layout area.

Figure 9:
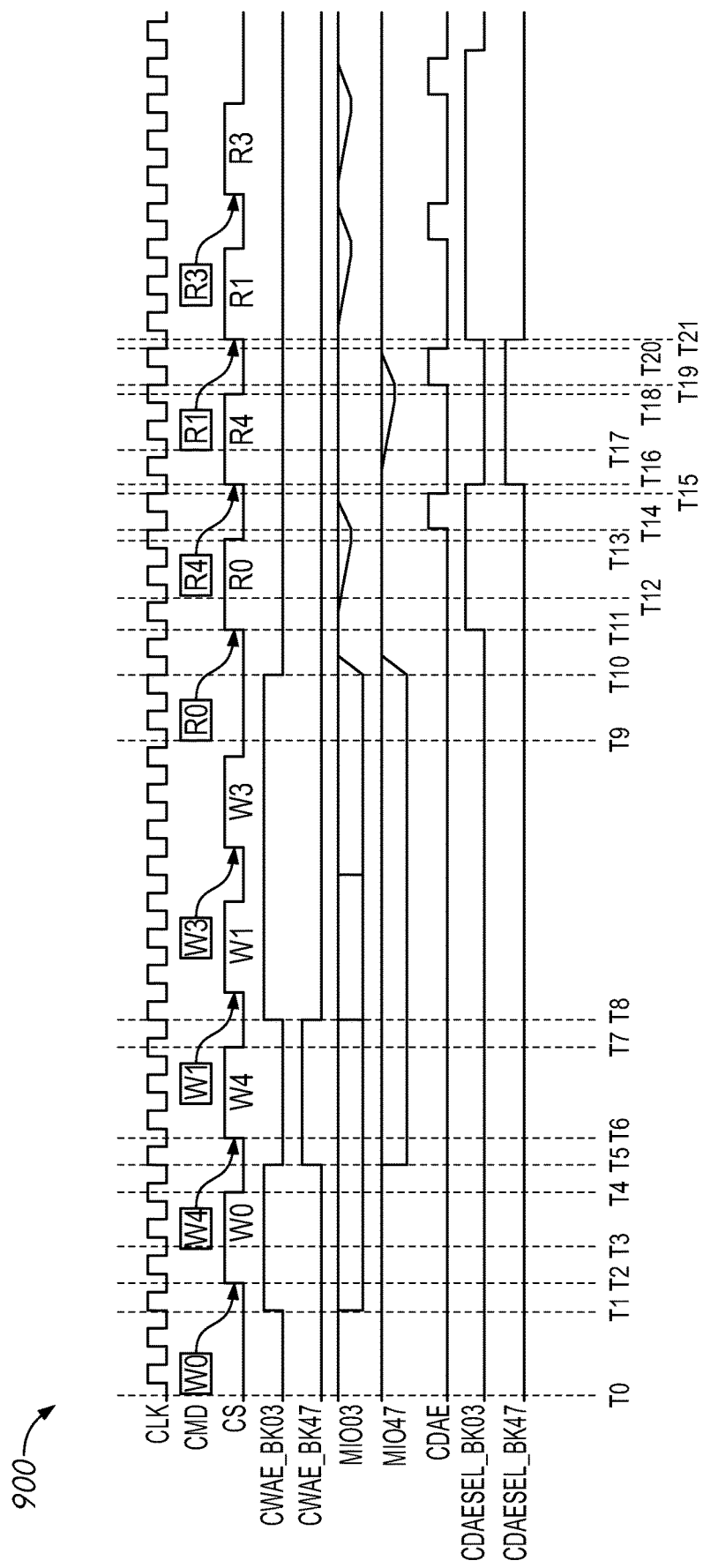
FIG. 9 is a timing diagram of various signals within a semiconductor memory device during memory operations according to embodiments of the present disclosure.

FIG. 9 is a timing diagram of various signals within a semiconductor memory device during memory operations according to embodiments of the present disclosure. The states of signals within semiconductor device 100 and/or semiconductor memory device 800 during read and write operations may be reflected in timing diagram 900, and the signals of timing diagram 900 will be described with reference to FIGS. 1 and 8. However timing diagram 900 may reflect the operation of other memory devices other than the specific memory device shown in FIGS. 1 and 8.

The first line of timing diagram 900 illustrates a clock signal (CLK). In some examples, the clock signal may be an internal clock signal generated by an internal clock generator, such as internal clock generator 114. The second line of timing diagram 900 illustrates commands (CMD). In some examples, the commands CMD may be received by a command decoder, such as command decoder 106. In some examples, the commands CMD may be provided to the memory device by another device, such as a memory controller (not shown). The third line of timing diagram 900 illustrates a column select signal (CS) provided by a column decoder, such as column decoder 110. The column select signal CS may be issued responsive to the command decoder receiving the command CMD. In some embodiments, the command decoder may provide a signal associated with the command CMD (e.g., internal command) to the column decoder and the column select signal CS may be provided responsive, at least in part, to the signal provided by the command decoder. The fourth line of timing diagram 900 illustrates the state of a write driver enable signal (CWAE_BK03). The write driver enable signal CWAE_BK03 may be provided to write drivers coupled to main data lines that that are coupled to all banks of a memory array, such as write drivers 810 and 812. The fifth line of timing diagram 900 illustrates the state of a write driver enable signal (CWAE_BK47). The write driver enable signal CWAE_BK47 may be provided to write drivers coupled to main data lines that that are coupled to a subset of banks of the memory array, such as write drivers 824 and 826. The sixth line of timing diagram 900 illustrates the state of a main data line (MIO03) coupled to at least some of the banks of the memory array, such as main data lines 806 and 808. The seventh line of timing diagram 900 illustrates the state of a main data line (MIO47) coupled to a subset of banks of the memory array, such as main data lines 820 and 822. The eighth line of timing diagram 900 illustrates the state of a data amplifier enable signal (CDAE), which may enable data sense amplifiers such as data sense amplifiers 814. The final lines of timing diagram 900 illustrate the state of switch control signals CDAESEL_BK03 and CDAESEL_BK47 provided to switches for selectively coupling main data lines to the data sense amplifier, such as switches 830 and 832 respectively, during read operations. In some embodiments, the enable signals CWAE_BK03, CWAE_BK47, and/or CDAE and/or control signals CDAESEL_BK03 and/or CDAESEL_BK47 may be provided by the command controller and/or the column decoder.

At or around time T0, a write command W0 may be received by the semiconductor memory device (e.g., semiconductor device 100 and/or 800). In some examples, the write command W0 may be received by the command decoder 106 from an external device, such as a memory controller. The write command W0 may indicate data is to be written to bank BK0 of the memory array 802 (and/or BANK0 of memory array 118). Responsive, at least in part, to the write command W0, the write drive enable signal CWAE_BK03 may transition from an inactive (e.g., low) state to an active (e.g., high) state at or around time T1. The active CWAE_BK03 signal may enable write driver 810 and/or 812 to drive data on a main data line 806 and/or 808.

Also at or around time T1, data to be written to bank BK0/BANK0 may be provided on the main data line MIO. At or around time T2, responsive, at least in part to receiving the write command W0, the column decoder may provide a column select signal CS associated with the write command W0. Responsive, at least in part to the column select signal CS, data may be driven from the main data line 806 and/or 808 to a sub-amplifier (e.g., sub-amplifier 300 and/or sub-amplifier 128) to a sense amplifier 126 to memory cells of the bank BK0/BANK0.

At or around time T3, a write command W4 may be received by the semiconductor memory device. The write command W4 may indicate data is to be written to bank BK4/BANK4 of the memory array. At or around time T4, the column select signal CS may transition to an inactive state. Responsive, at least in part, to the write command W4, the write drive enable signal CWAE_BK47 may transition to an active state and CWAE_BK03 may transition to an inactive state. The active CWAE_BK47 signal may enable write drivers 824, 826 and the inactive CWAE_BK03 signal may disable write drivers 810, 812. At or around time T5, data to be written to bank BK4/BANK4 may be provided on the main data line MIO47W (e.g., main data lines 820 and/or 822). At or around time T6, responsive, at least in part to receiving the write command W4, the column decoder may provide a column select signal CS associated with the write command W4 until at or around time T7. Responsive, at least in part to the column select signal CS, data may be driven from the main data line MIO47W to sub-amplifier 300 and/or 128 to a sense amplifier 126 to memory cells of the bank BK4/BANK4. At or around time T8, the CWAE_BK47 signal may transition to an inactive state (e.g., low), which may disable write drivers 824 and 826.

As shown in timing diagram 900, additional write commands may be received by semiconductor memory device. Write operations to BK0-3/BANK0-3 may be performed in a similar manner to the write operation performed responsive to write command W0 and write operations to BK4-7/BANK4-7 may be performed in a similar manner to the write operation performed responsive to write command W4.

At or around time T9, a read command R0 may be received by the command decoder. The read command R0 may indicate data is to be read from bank BK0/BANK0 of the memory array. At or around time T10, the CWAE_BK03 may transition to an inactive state which may disable write drivers 810, 812. At or around time T11, responsive at least in part to the read command R0, the column decoder may provide a column select signal CS associated with the read command R0. Also at or around time T11, the switch control signal CDAESEL_BK03 may transition to an active state (e.g., high). The active CDAESEL_BK03 signal may cause a switch (e.g., switch 830) and/or other control logic to couple main data line 806 and/or 808 to data sense amplifiers 814. Responsive at least in part to the column select signal CS, at or around time T12, data from memory cells of bank BK0/BANK0 may be provided on the main data line MIO (e.g., main data line 806 and/or 808).

Also at or around time T12, a read command R4 may be received by the command decoder. The read command R4 may indicate data is to be read from bank BK4/BANK4 of the memory array. At or around time T13, the column select signal CS may transition to an inactive state. At or around time T14, the data amplifier enable signal CDAE may transition to an active state (e.g., high). The CDAE signal may enable data amplifiers 814, which may amplify data received from the main data lines 806, 808 and provide the read data from bank BK0/BANK0 to a global data bus. At or around time T15, the CDAE signal may return to an inactive state (e.g., low), which may disable data amplifiers 814. At or around T16, responsive at least in part to the read command R4, the column select signal CS may be provided associated with the read command R4. Responsive, at least in part to the column select signal CS, CDAESEL_BK03 may transition to an inactive (e.g., low) state, which may cause a switch or other logic circuitry to decouple main data line 806 and/or 808 from data sense amplifier 814 at or around time T16. Also responsive, at least in part to the column select signal CS, at or around time T16, switch control signal CDAESEL_BK47 may transition from an inactive state to an active state, which may cause a switch (e.g., switch 832) or other logic circuitry to couple main data line 820 and/or 822 to the data sense amplifier 814. Further responsive at least in part to the column select signal CS, data from memory cells of bank BK4/BANK4 may be provided on the main data line MIO at or around time T17. At or around T18, the column select signal CS may transition to an inactive state. At or around time T19, the data amplifier enable signal CDAE may transition to an active state. The CDAE signal may enable data amplifiers 814, which may amplify data received from the main data lines 820, 822 and provide the read data from bank BK4/BANK4 to a global data bus. At or around time T20, the CDAE signal may return to an inactive state, which may disable data amplifiers 814. At or around time T21, the CDAESEL_BK47 signal may transition to an inactive state which may cause main data line 520 and/or 522 to be decoupled from the data sense amplifiers 814.

As shown in timing diagram 900, additional read commands may be received by semiconductor memory device. Read operations for banks BK0-3/BANK0-3 may be performed in a similar manner to the read operation performed responsive to read command R0 and read operations for banks BK4-7/BANK4-7 may be performed in a similar manner to the read operation performed responsive to read command R4.

As shown in timing diagram 900, similar to timing diagram 700, write operations for one group of banks utilize a different main data line and activate a different write driver enable signal than for write operations for another group of banks. In the example shown in FIG. 9, write operations for banks BK0-3/BANK0-3 utilize main data line MIO03 and activate write driver enable signal CWAE_BK03, while write operations for banks BK4-7/BANK4-7 utilize main data line MIO47 and activate write driver enable signal CWAE_BK47. While the read operations for all of the banks activate the same data amplifier enable signal, additional control signals are utilized to couple the different main data lines to the data amplifier enable signal. Read operations for one group of banks activate a different control signal than read operations for another group of banks. In the example shown in FIG. 9, read operations for banks BK0-3/BANK0-3 activate switch control signal CDAESEL_BK03 while read operations for banks BK4-7/BANK4-7 activate switch control signal CDAESEL_BK47.

Thus, in comparing FIGS. 9 and 7 to FIG. 4, having separate main data lines for different banks for read and/or write operations may utilize more enable signals and/or control signals than when a same main data line for all banks for read and write operations in some embodiments. However, in some applications, the disadvantages of the additional signal lines and current requirements to provide the additional signals may still be outweighed by the advantages of reducing the current draw for at least some read and/or write operations.

As disclosed herein, separate main data lines may be used to provide data to different banks of the memory array for write operations and/or read operations. In some applications, using different main data lines for different banks may reduce current draw of the memory during memory operations.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present apparatuses, systems, and methods and should not be construed as limiting the appended claims to any particular embodiment or group of embodiments. Thus, while the present apparatuses, systems, and methods have been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a memory array comprising a plurality of banks, wherein each bank of the plurality of banks includes a plurality of mats each including a respective first mat;
a first plurality of main data lines each coupled to at least a first subset of the plurality of banks and each of the first plurality of main data lines configured to receive read data and provide write data to the first subset of the plurality of banks, wherein the first plurality of main data lines includes a first main data line;
a second plurality of main data lines each coupled to a second subset of the plurality of banks and each of the second plurality of main data lines configured to provide write data to the second subset of the plurality of banks, wherein a length of the second plurality of main data lines is less than a length of the first plurality of main data lines, wherein each of the first plurality of main data lines are further coupled to the second subset of the plurality of banks and each of the first plurality of main data lines are further configured to receive read data from the second subset of the plurality of banks,. wherein the second plurality of main data lines includes a second main data line, wherein the first main data line is configured to write data only to the respective first mats of the first subset of the plurality of banks, and wherein the second main data line is configured to write data only to the respective first mats of the second subset of the plurality of banks:
a plurality of local data lines;
a plurality of sub-amplifiers coupled between the plurality of local data lines and the first plurality of main data lines and the second plurality of main data lines;
a plurality of bit lines coupled to memory cells of the memory array;
a plurality of sense amplifiers coupled between the local data lines and the bit lines;

a global data bus coupled to the first plurality of main data lines and the second plurality of main data lines; and
an input/output circuit coupled to the global data bus.

2. The apparatus of claim 1, wherein each of the second plurality of main data lines are further configured to receive read data from the second subset of the plurality of banks.

3. The apparatus of claim 2, further comprising a selection circuit configured to selectively couple individual ones of the first plurality of main data lines and individual ones of the second plurality of main data lines to corresponding ones of a plurality of data sense amplifiers.

4. The apparatus of claim 1, further comprising:
a first plurality of write drivers coupled between the first plurality of main data lines and the global data bus, the first plurality of write drivers and enabled by a first write enable signal; and
a second plurality of write drivers coupled between the second plurality of main data lines and the global data bus, the second plurality of write drivers and enabled by a second write enable signal.

5. The apparatus of claim 1, wherein individual ones of the first plurality of main data lines and individual ones of the second plurality of main data lines are arranged in an alternating pattern over the memory array.

6. The apparatus of claim 5, wherein the apparatus further comprises shield lines aligned with the second plurality of main data lines extending over the first subset of the plurality of banks.

7. An apparatus comprising:
a. memory array comprising a plurality of banks wherein each bank of the plurality of banks includes a plurality of mats each including a respective first mat;
a first plurality of main data lines each coupled to the plurality of banks and each configured to receive read data from the plurality of banks, wherein the first plurality of main data lines includes a first main data line:
a second plurality of main data lines each coupled to a subset of the plurality of banks and configured to provide write data to the subset of the plurality of banks, wherein each of the first plurality of main data lines is further configured to provide the write data to a remaining set of the plurality of banks, wherein the remaining set of the plurality of banks is exclusive of the subset of the plurality of banks, wherein the second plurality of main data lines includes a second main data line, wherein the second main data line is configured to write data only to the respective first mats of the subset of the plurality of banks, and wherein the first main data line is configured to write data only to the respective first mats of the remaining set of the plurality of banks;
a plurality of local data lines;
a plurality of sub-amplifiers coupled between the plurality of local data lines and the first plurality of main data lines and the second plurality of main data lines;
a plurality of bit lines coupled to memory cells of the memory array;
a plurality of sense amplifiers coupled between the local data lines and the bit lines;
a global data bus coupled to the first plurality of main data lines and the second plurality, of main data lines; and
an input/output circuit coupled to the global data bus.

8. The apparatus of claim 7, further comprising a read/write amplifier coupled to the first plurality of main data lines and the second plurality of main data lines and further coupled to the global data bus, wherein the remaining set of the plurality of banks are farther from the read/write amplifier than the subset of the plurality of banks.

9. The apparatus of claim 7, wherein each of the sub-amplifiers comprises:
  a first transistor having a first node coupled to a local data line of the plurality of local data lines and a second node coupled to a main data line of the second plurality of main data lines; and
  a second transistor having a first node coupled to a main data line of the first plurality of main data lines and a second node coupled to a third transistor.

10. The apparatus of claim 9, wherein the plurality of local data lines provide the write data to and the read data from the subset of the plurality of banks.

11. The apparatus of claim 9, wherein the sub-amplifier is configured to couple the main data line of the first plurality of main data lines to the local data line during a read operation and to couple the main data line of the second plurality of main data lines to the local data line during a write operation.

* * * * *